United States Patent [19]

Sugawara et al.

[11] Patent Number: 4,946,734
[45] Date of Patent: Aug. 7, 1990

[54] RESIN COMPOSITION FOR PRINTED CIRCUIT BOARD AND SUCH BOARD FORMED BY USE THEREOF

[75] Inventors: Katuo Sugawara, Hitachi; Akio Takahashi, Hitachiota; Masahiro Ono, Hitachi; Toshikazu Narahara, Ibaraki, all of Japan

[73] Assignee: Hitachi, Ltd., Tokyo, Japan

[21] Appl. No.: 122,268

[22] Filed: Nov. 18, 1987

[30] Foreign Application Priority Data

Nov. 21, 1986 [JP] Japan .................... 61-276591

[51] Int. Cl.$^5$ .................... B05D 1/00
[52] U.S. Cl. .................... 428/209; 428/267; 428/443.5; 428/542.8; 428/901; 524/96
[58] Field of Search .................... 428/267, 209, 542.8, 428/473.5, 901

[56] References Cited

U.S. PATENT DOCUMENTS

| | | | |
|---|---|---|---|
| 4,191,715 | 3/1980 | Wu et al. | 528/168 X |
| 4,276,344 | 6/1981 | Frosh | 428/260 |
| 4,550,177 | 10/1935 | Kumar et al. | 548/413 |
| 4,634,759 | 1/1987 | Kumar et al. | 528/321 |

FOREIGN PATENT DOCUMENTS

0059434 6/1981 European Pat. Off. .

Primary Examiner—Joseph L. Schofer
Assistant Examiner—J. M. Reddick
Attorney, Agent, or Firm—Antonelli, Terry, Stout & Kraus

[57] ABSTRACT

A resin composition for printed circuit board and the printed circuit board in which said resin composition is used as substrate, said resin composition comprising one or more cyclic phosphonitrile compounds represented by the general formula [I] and/or [II] and an aromatic maleimide compound and/or an aromatic amine:

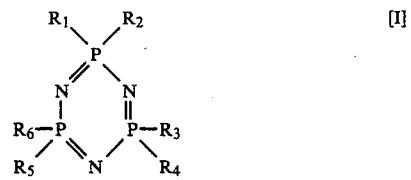

[I]

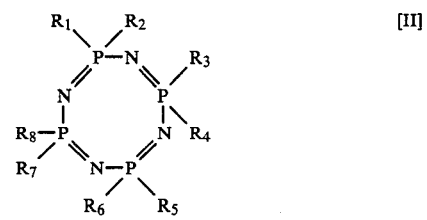

[II]

wherein at least two of R's ($R_1$ to $R_8$) are groups represented by

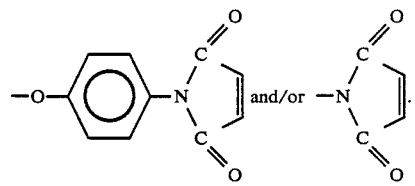

4 Claims, 1 Drawing Sheet

4,946,734

RESIN COMPOSITION FOR PRINTED CIRCUIT BOARD AND SUCH BOARD FORMED BY USE THEREOF

FIELD OF THE INVENTION AND RELATED ART STATEMENT

1. Field of the Invention

This invention relates to a resin composition and a printed circuit board. More particularly, it relates to a resin composition for printed circuit board, which is excellent in electric characteristics in moist condition and resists deterioration in reliability of the substrate even when exposed to a high temperature; the invention relates also to a printed circuit board formed by the use of such a resin composition.

2. Related Art Statement

Various flame retardants have heretofore been proposed for use as one of the materials for multilayer printed circuit boards in order to make the boards flame retardant.

Examples of flame retardants generally used in synthetic resins include antimony-based compounds such as antimony trioxide; halogen-containing phosphite compounds such as triphenyl phosphite, tris($\beta$-chloroethyl) phosphite, tris(dichloropropyl) phosphite, and tris(dibromopropyl) phosphite; and various halogenated compounds such as chlorinated polyethylene, pentachlorophenol, tetrabromobutane, and decabromodiphenyl ether. As examples of reactive flame retardants, there may be mentioned various halogenated compounds such as chlorinated or brominated epoxy resins, dichloromaleic anhydride, tetrachlorophthalic anhydride, tetrabromophthalic anhydride, and "Het" acid anhydride (chlorendic anhydride); and phosphorus-containing polyol compounds. It is also proposed recently to use cyclotriphosphazenes, etc. [e.g., Japanese Patent Application "Kokai" (Laid-open) No. 120,850/86].

As examples with regard to laminated boards, mention may be made of flame retardants described in "Densi Zairyo" (Electronic Materials), Vol. 10, No. 7, pp. 130–136 (1971) and Japanese Patent Application "Kokai" (Laid-open) No. 3,486/78.

The flame retardants for the resins used in printed circuit boards are required to have the following properties: (1) a high compatibility with the synthetic resins and a high stability, (2) no tendency to deteriorate electrical, physical or mechanical characteristics of the cured resins, and (3) a high thermal stability and no tendency to generate corrosive or poisonous gases even when subjected to high temperatures during the soldering. The antimony trioxide has disadvantages in that it fails to exhibit sufficient flame retardancy unless added in large amounts and, as a consequence, in making a printed board, the impregnation of a glass cloth, etc., with the resin cannot be sufficiently performed, thus resulting in an unsatisfactory substrate. Moreover, the halogenated compounds are thermally unstable and in the case of a printed circuit board which is especially required to be thermally stable, there occurs generation of corrosive poisonous gases or formation of bubbles upon exposure to high temperatures during processing. Furthermore, a printed circuit board fabricated by using a halogenated flame retardant has a low water resistance and the hydrolysis of the flame retardant adversely affect the whole circuitry and, in addition, upon exposure to a high humidity atmosphere the electric characteristics of the circuit board are deteriorated to a large extent.

There is also known a polymer derived from hexachlorocyclotriphosphazene, which is flame retardant and highly heat resisting (U.S. Pat. No. 4,550,177). However, in making a substrate, this polymer is found unsuitable for use as such, because the polymer reveals difficulties in moldability and in application as a varnish.

The substrate for printed circuit boards, which is used in most cases in a condition open to the atmosphere, loses its reliability if deterioration takes place in electric characteristics by moisture absorption. For this reason, a substrate is required to have a water absorption sufficiently low to keep it from changes in electric characteristics. Further, the substrate is exposed to high temperature in mounting thereon electronic parts to establish electric connections or by heat bonding. For this reason, if there occurs in a short period of time bubble formation or lifting in the substrate it becomes impossible to mount the electronic parts, or if the flexural strength or peel strength of copper foil becomes deteriorated at high temperature deformation of the substrate or lifting of the conductor tends to take place, resulting in a decrease in reliability of the substrate. Therefore, a desirable substrate should have a solder resistance sustained for an extended period of time, a high flexural strength at high temperatures and a high peel strength of copper foil at high temperatures.

SUMMARY OF THE INVENTION

The present inventors conducted an extensive study to obviate the brittleness and the low processability (high molding temperature) of synthetic resins incorporated with the aforementioned compound having a phosphonitrile ring, while retaining excellent heat and moisture resistances. As a result, it was found that it is possible to improve the reactivity of said compound and various characteristics, especially moisture resistance of the cured resin by incorporating an aromatic maleimide compound and/or an aromatic amine compound with an appropriate amount of the said compound having a phosphonitrile ring. The present invention is based upon the above discovery.

In one aspect of this invention, it relates to a resin composition for printed circuit boards, which is capable of producing a printed circuit board which, as compared with conventional printed circuit boards, is improved in flame retardancy, is less subject to the deterioration in electric characteristics caused by moisture absorption at high temperatures and is capable of retaining the reliability of substrate.

In another aspect, this invention relates to a printed circuit board which is not only heat resistant and flame retardant but also exhibits excellent electric characteristics and greatly improved reliability at high temperatures and high humidities.

The resin composition for printed circuit board according to this invention is a compounded mixture of one or more cyclic phosphonitrile compounds represented by the following formula [I] and/or formula [II] and a specific bismaleimide or amine compound:

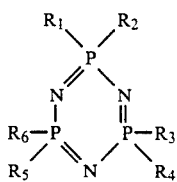

[I]

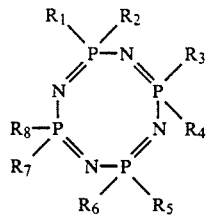

[II]

wherein at least two of R's ($R_1$ to $R_8$) are groups selected from

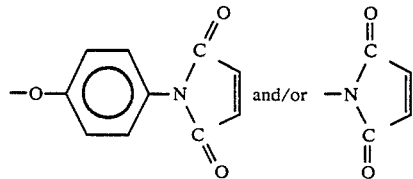

and the rest are groups selected from —H, —OH,

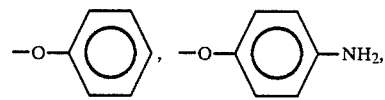

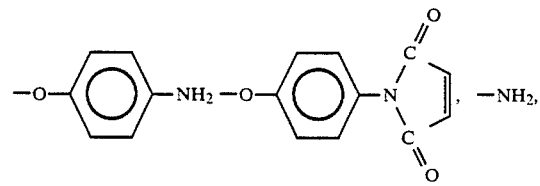

—OH—CH=CH$_2$, —O—CH$_2$—CH=CH$_2$ and —O—CF$_2$—CF=CF$_2$.

The printed circuit board according to this invention is prepared in a customary way. A varnish is prepared from the cyclic phosphonitrile compound and the maleimide and/or amine compound. A suitable base material in sheet form is impregnated with the varnish to yield a prepreg. A copper-clad substrate or the like is obtained by using the prepreg.

DETAILED DESCRIPTION OF PREFERRED EMBODIMENTS

Figure 1:
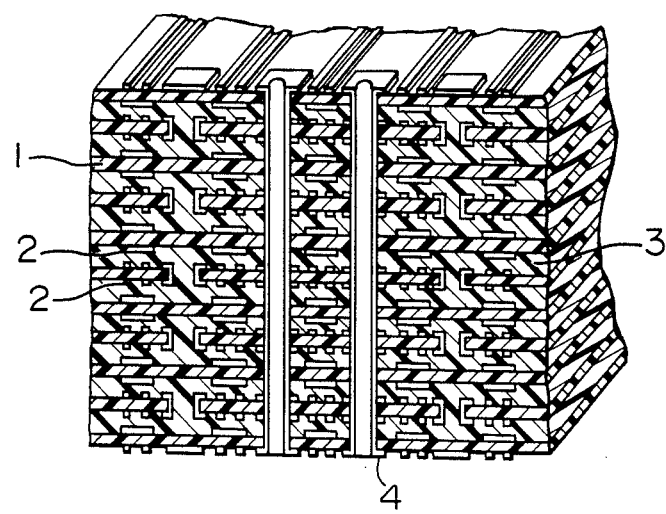
FIG. 1 is an enlarged sectional view of a part of printed circuit board prepared by using the composition of this invention. 1-denotes a cured sheet employing the resin of this invention, 2 a circuit, and 3 a prepreg resin sheet employing the resin composition of this invention.

Of the cyclic phosphonitrile compounds, those suitable for use according to this invention are phosphazene compounds represented by the general formulas [I] and [II], which have at least two substituent groups

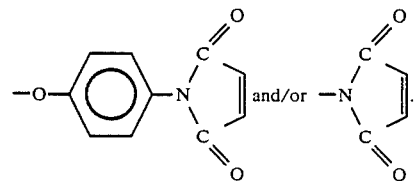

Such a compound is hereinafter referred to as maleimidized cyclophosphonitrile compound. Desirable maleimidized phosphonitrile compound has at least two more substituents, which may be the same or different, selected from —OH,

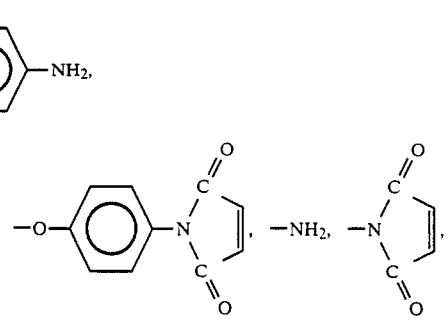

—O—CH=CH$_2$, —CH$_2$—CH=CH$_2$ and —O—CF$_2$—CF=CF$_2$. The maleimidized phosphonitrile compound having such substituents undergoes addition polymerization owing to said substituents and produces a preferable substrate.

As the rest of R's, mention may be made of, in addition to the same substituents as those listed above, H, alkyl (which may have an amino substituent), alkenyl, alkyloxy, phenoxy, aryl (which may have an amino substituent), and NH$_2$ groups.

The maleimidized cyclic phosphonitrile compounds can be synthesized by known methods such as, for example, those described in U.S. Pat. No. 4,550,177. Commercial products may also be used.

The maleimide compounds used together with the maleimidized cyclic phosphonitrile compounds are selected, in view of processability from aromatic maleimide compounds. Examples of such aromatic maleimide compounds used in this invention include bismaleimide compounds such as N,N'-m-phenylenebismaleimide, N,N'-p-phenylenebismaleimide, N,N'-4,4'-diphenylmethanebismaleimide, N,N'-4,4'-diphenyl ether bismaleimide, N,N'-methylenebis(3-chloro-p-phenylene)bismaleimide, N,N'-4,4'-diphenyl sulfone bismaleimide, N,N'-m-xylenebismaleimide, N,N'-4,4'-diphenylcyclohexanebismaleimide, 2,2-bis[-4-(4-maleimidophenoxy)phenyl]propane, and 2,2-bis[4-(4-maleimidophenoxy)phenyl]hexachloropropane; polyvalent maleimide obtained by reacting aniline-formaldehyde condensate with maleic anhydride; monomaleimide compounds such as N-phenylmaleimide, N-3-chlorophenylmaleimide, N-o-tolylmaleimide, N-m-tolylmaleimide, N-p-tolylmaleimide, N-o-methoxyphenylmaleimide, N-m-methoxyphenylmaleimide, N-p-methoxyphenylmaleimide, N-benzylmaleimide, N-pyridylmaleimide, N-hydroxyphenylmaleimide, N-acetoxyphenylmaleimide, N-dichlorophenylmaleimide, N-benzophenonemaleimide, N-diphenyl ether maleimide, and N-acetylphenylmaleimide. Especially preferred are N,N'-4,4'-diphenylmethanebismaleimide, and 2,2-bis[4-(4-maleimidophenoxy)phenyl]propane.

The amine compounds are selected, from the standpoint of heat resistance of the substrate, from aromatic compounds. Examples of suitable aromatic amine compounds include m-phenylenediamine, p-phenylenediamine, 4,4'-diaminodiphenylmethane, 2,2'-bis(4-aminophenyl)propane, benzidine, 4,4'-diaminophenyl sulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, 1,1-bis(p-aminophenyl)furan, p-xylylenediamine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5-d)thiazole, 5,5'-di(m-aminophenyl)-(2,2')-bis(1,3,4-oxadiazolyl), 4,4'-diaminodiphenyl ether, 4,4'-bis(p-aminophenyl)-2,2'-diazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine, 4,4'-methylenebis(2-dichloroaniline), benzoguanamine, methylguanamine, 1,2,4-triaminobenzene, 1,3,5-triaminobenzene, 2,4,6-triaminotoluene, 2,4,6-triamino-1,3,5-trimethylbenzene, 2,4,4'-triaminodiphenyl ether, 2,4,4'-triaminodiphenylmethane, 2,4,4'-triaminodiphenyl sulfone, 2,4,4'-triaminobenzophenone, 2,2-bis[4-(4-aminophenoxy)phenyl]propane, 2,2-bis[4-(4-aminophenoxy)phenyl]hexafluoropropane, 4,4'-bis(3 -aminophenoxy)biphenyl, 1,3-bis(3-aminophenoxy)benzene, 1,3-bis-(4-aminophenoxy)benzene, 3,5,3',5'-tetraaminobenzophenone, 1,2,4,5-tetraaminobenzene, and aniline resins. Especially preferred are 4,4'-diaminodiphenylmethane and 2,2'-bis[4-(4-aminophenoxy)phenyl]propane.

The ratio between the maleimidized cyclic phosphonitrile compound and the aromatic maleimide or aromatic amine compound is generally 10 to 1,000, preferably 50 to 500 parts by weight of the aromatic maleimide compound and/or 10 to 200, preferably 20 to 100 parts by weight of aromatic amine compound for 100 parts by weight of the phosphonitrile compound. In general, with the increase in the amount of cyclic phosphonitrile compound, the flame retardancy and the heat resistance of the cured resin are improved while the processability becomes inferior. Therefore, it is, of course, important to select the ratio in accordance with the purpose of use of the substrate.

In making a printed circuit board of this invention, at first a varnish is prepared by dissolving a maleimidized cyclic phosphonitrile compound and an aromatic maleimide compound or an aromatic amine compound in an organic solvent. Examples of suitable organic solvents are toluene, xylene, acetone, methyl ethyl ketone, methyl isobutyl ketone, N,N -dimethylformaldehyde, N-methylpyrrolidone, dimethyl sulfoxide, trichloroethylene, trichloroethane, methylene chloride, dioxane, and ethyl acetate. Other organic solvents capable of uniformly dissolving the resin composition may also be freely used. If necessary, the varnish be subjected to preliminary reaction by heating to adjust flow properties, gelation time or the like in making a laminated board. It is also possible to add to the varnish various coupling agents to improve the adhesion to the cloth.

Next, the impregnation varnish thus obtained is applied by impregnation to a base material in sheet form, and the impregnated sheet is dried at a temperature from room temperature to 170° C. to obtain a nontacky prepreg. The drying temperature depends upon the type of solvent which is used.

Then, the prepreg is placed between two copper foils and formed by applying heat and pressure at 100° to 250° C. and 1 to 100 kg·f/cm$^2$ to produce a substrate clad on both sides with copper foil for forming a conductor circuit.

After forming circuit patterns on the resulting copper-clad substrates, necessary number of the substrates are stacked, then held between two prepreg sheets and bonded together at 100° to 250° C. and 1 to 100 kg·f/cm$^2$ to obtain a multilayer board. The resulting board is drilled to provide a through-hole for interlayer connection. The through-hole is copper-plated to effect the interlayer connection and finally conductor circuits are provided on both outermost layers to obtain a printed circuit board.

The base materials in sheet form for use in the printed circuit board according to this invention are those commonly used in printed substrate. There are used inorganic fibrous materials including fibers of various glasses such as E glass, C glass, A glass, S glass, D glass, and YM-31-A glass which are made chiefly from silica, alumina, or the like and Q glass made from quartz and organic fibers including aramid fiber which is made from aromatic polyamide.

According to this invention, there is no need to use halogen compounds or antimony compounds to impart flame retardancy. As a consequence, even when a prepreg made by impregnating a reinforcing base material with the resin composition of this invention is compression molded under application of heat, there is no emission of corrosive, poisonous gases and, in addition, the resin composition does not adversely affect the impregnation of the base material in preparing a circuit board. Moreover, according to this invention, even when used under atmospheric conditions, the substrate of printed circuit board is excellent in electric characteristics owing to low water absorption; the substrate is hardly subject to bubble formation or lifting because of sufficient solder resistance at high temperatures and deformation of the substrate or lifting of conductor (circuit) is difficult to occur due to high flexural strength and high peel strength of copper foil at high temperatures.

Therefore, the present invention provides printed circuit boards of high reliability.

EXAMPLES

The invention is illustrated hereunder with reference to Examples, but the invention is, of course, not limited thereto.

EXAMPLE 1

Into 500 g of N,N-dimethylformamide (DMF) solvent, were dissolved 100 g of hexakis(4-maleimidephenoxy)cyclotriphosphazene (HMCP) as cyclic phosphonitrile compound and 250 g of N,N'-4,4'-diphenylmethanebismaleimide (BMI). The solution was allowed to react by heating with stirring at 120° C. for 60 minutes to yield a varnish for impregnation. A glass cloth, 0.1 mm thick, was impregnated with the varnish and dried at 160° C. for 10 minutes to yield a prepreg. Ten prepreg sheets were stacked, then placed between two copper foils, 35 μm thick, which had been treated with an adhesive, and heated at 170° C. under an applied pressure of 5 kg·f/cm$^2$ for 10 minutes, then at 40 kg·f/cm$^2$ for 120 minutes while elevating the temperature from 170° C. to 230° C. to obtain a substrate clad with copper on both sides for use in printed circuit boards.

EXAMPLES 2 TO 20 AND COMPARATIVE EXAMPLES 1 AND 2

Both-side copper-clad substrates were prepared in the same manner as in Example 1, except that various formulations as shown in Table 1 were used and the amount of solvent was adjusted so as to make the resin content 40% on solids basis.

Varnishes of Examples 1 to 20 and Comparative Example 2 were tested for gelation time at 170° C. by the hot plate method. During the test it was found that after evaporation of the solvent, the residue of each varnish of Examples was a resinous matter of decreased viscosity, indicating a fluidity. The residue of Comparative Example 1, wherein hexakis(4-maleimidophenoxy)cyclotriphosphazene alone was used, was powdery and showed no fluidity. For this reason, a satisfactory substrate was not obtained from the varnish of Comparative Example 1.

COMPARATIVE EXAMPLE 3

Into 500 g of DMF solvent, were dissolved 100 g of DER-332 and 200 g of an epoxy resin of the brominated bisphenol-A type (DER-511, 18-20% bromine content, Dow Chemical Co.). To the solution were added 50 g of 4,4'-diaminodiphenylmethane and 5 g of antimony trioxide. The resulting solution was allowed to react by heating with stirring at 100° C. for 30 minutes to yield a varnish for impregnation. A glass cloth, 0.1 mm thick, was impregnated with the varnish and dried at 160° C. for 10 minutes. A both-side copper-clad substrate for printed circuit board was prepared under the same conditions as in Example 1.

Principal characteristics of the cured resins and the printed circuit boards obtained in Examples and Comparative Examples were as shown in Table 2.

The water absorption and the volume resistivity were tested according to JIS C 6481 on the specimen prepared by removing copper foils on both sides of the substrate by etching with a ferrous chloride solution.

The flammability was tested by the vertical method of UL-94.

The solder resistance, peel strength of copper foil, and flexural characteristics were tested according to JIS C 6481.

The retention of flexural strength was expressed as percentage ratio of the flexural strength (room temperature) after degradation to that before degradation.

As is apparent from the results of Examples, as compared with the case in which a phosphazene was used alone, the resin compositions incorporated with an aromatic maleimide and/or aromatic amine compound exhibited excellent fluidity and there is obtained a laminated material for printed circuit boards which is excellent in heat resistance and moisture resistance and showed a flammability corresponding to class V-O of UL Standards without addition of conventional flame retardant.

TABLE 1

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Hexakis(4-maleimidophenoxy)-cyclotriphosphazene | 100 | 100 | 100 | — | — | — | — | — | 100 | 100 | — |
| Tris(4-maleimidophenoxy)-tris(phenoxy)cyclotriphosphazene | — | — | — | 100 | 100 | 100 | — | — | — | — | 100 |
| Tetrakis(4-maleimidophenoxy)-tetrakis(phenoxy)cyclotetraphosphazene | — | — | — | — | — | — | 100 | 100 | — | — | — |
| N,N'-4,4'-diphenylmethane-bismaleimide | 250 | 500 | — | 250 | 500 | — | 500 | — | 250 | — | — |
| 2,2'-Bis[4-(4-maleimidophenoxy)phenyl]propane | — | — | 500 | — | — | 500 | — | 500 | 250 | — | — |
| 4,4'-Diaminodiphenylmethane | — | — | — | — | — | — | — | — | — | 50 | 50 |

| | Example | | | | | | | | | Comparative Example | |
|---|---|---|---|---|---|---|---|---|---|---|---|
| | 12 | 13 | 14 | 15 | 16 | 17 | 18 | 19 | 20 | 1 | 2 |
| Hexakis(4-maleimidophenoxy)-cyclotriphosphazene | — | — | — | — | — | — | — | — | — | 100 | — |
| Tris(4-maleimidophenoxy)-tris(phenoxy)cyclotriphosphazene | — | 100 | 100 | 100 | 100 | 50 | 100 | 50 | 50 | — | — |
| Tetrakis (4-maleimidophenoxy)-tetrakis(phenoxy)cyclotetraphosphazene | 100 | — | — | — | — | 50 | — | 50 | 50 | — | — |
| N,N'-4,4'-diphenylmethane-bismaleimide | — | 10 | 50 | 100 | 1000 | 500 | 500 | 500 | 250 | — | 100 |

TABLE 1-continued

| | | | | | | | | | | | |
|---|---|---|---|---|---|---|---|---|---|---|---|
| 2,2'-Bis[4-(4-maleimido-phenoxy)phenyl]propane | — | — | — | — | — | — | — | — | 250 | — | — |
| 4,4'-Diaminodiphenylmethane | 50 | — | — | — | — | — | 50 | 50 | 50 | — | — |

TABLE 2

| | | Example | | | | | | | | | | |
|---|---|---|---|---|---|---|---|---|---|---|---|---|
| Item | | 1 | 2 | 3 | 4 | 5 | 6 | 7 | 8 | 9 | 10 | 11 |
| Water absorption (%) | | 0.12 | 0.15 | 0.17 | 0.18 | 0.17 | 0.18 | 0.14 | 0.16 | 0.16 | 0.12 | 0.14 |
| Volume resistivity, normal ($\times 10^{16}$ Ω-cm) | 1.0 | 1.1 | 0.9 | 0.8 | 0.8 | 0.8 | 1.0 | 0.7 | 1.0 | 0.6 | 0.7 | |
| Volume resistivity, after moisture absorption ($\times 10^{14}$ Ω-cm) | 6.0 | 1.0 | 1.0 | 1.0 | 1.0 | 0.8 | 5.0 | 1.5 | 1.0 | 2.0 | 1.5 | |
| Flammability, UL-94 | V-0 | V-0 | V-0 | V-0 | V-0 | V-0 | V-0 | V-0 | V-0 | V-0 | V-0 | V-0 |
| Solder resistance, 300° C. (second) | >180 | >180 | 160 | >180 | >180 | 160 | >180 | 180 | 180 | 150 | 150 | |
| Copper foil peel strength (kg.f/cm$^2$) | RT | 1.1 | 1.0 | 1.1 | 1.2 | 1.2 | 1.3 | 1.1 | 1.2 | 1.2 | 1.4 | 1.1 |
| | 200° C. | 0.9 | 0.7 | 0.7 | 0.8 | 0.7 | 0.8 | 0.8 | 0.7 | 0.7 | 0.7 | 0.7 |
| Retention of flexural strength after degradation at 230° C. for 10 days (%) | | 75 | 70 | 64 | 72 | 65 | 63 | 71 | 65 | 68 | 62 | 62 |

| | | Example | | | | | | | | | Comparative Example | | |
|---|---|---|---|---|---|---|---|---|---|---|---|---|---|
| Item | | 12 | 13 | 14 | 15 | 16 | 17 | 18 | 19 | 20 | 1 | 2 | 3 |
| Water absorption (%) | | 0.14 | 0.14 | 0.14 | 0.15 | 0.22 | 0.16 | 0.16 | 0.16 | 0.15 | * | 0.35 | 0.20 |
| Volume resistivity, normal ($\times 10^{16}$ Ω-cm) | | 0.7 | 0.5 | 0.5 | 0.7 | 0.8 | 1.0 | 0.8 | 0.8 | 0.8 | * | 1.5 | 0.7 |
| Volume resistivity, after moisture absorption ($\times 10^{14}$ Ω-cm) | | 2.0 | 0.6 | 0.7 | 1.0 | 0.3 | 5.0 | 1.0 | 1.2 | 1.2 | * | 0.1 | 0.06 |
| Flammability, UL-94 | | V-0 | V-0 | V-0 | V-0 | V-0 | V-0 | V-0 | V-0 | V-0 | V-0 | V-1 | V-1 |
| Solder resistance, 300° C. | | 160 | 120 | 130 | >180 | >180 | >180 | 150 | 160 | 170 | * | 120 | 10> |
| Copper foil peel strength (kg.f/cm$^2$) | RT | 1.0 | 0.7 | 0.8 | 1.1 | 0.8 | 1.2 | 1.2 | 1.2 | 1.1 | * | 0.8 | 1.8 |
| | 200° C. | 0.8 | 0.6 | 0.6 | 0.7 | 0.6 | 0.8 | 0.7 | 0.7 | 0.7 | * | 0.7 | 0.2 |
| Retention of flexural strength after degradation at 230° C. for 10 days (%) | | 63 | 45 | 50 | 65 | 68 | 70 | 63 | 64 | 66 | * | 60 | 5 |

Note:
*Copper-clad substrate cannot be formed.

What is claimed is:

1. A printed circuit board formed by compression molding under application of heat from a prepreg sheet obtained by the impregnation of a reinforcing base material with a thermosetting resin composition comprising at least one cyclic phosphonitrile compound represented by the following formula [I] and [II] and at least one compound selected from the group consisting of an aromatic maleimide compound and an aromatic amine compound:

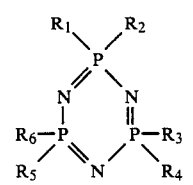

[I]

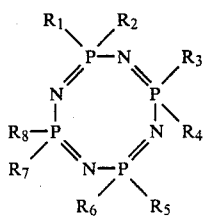

[II]

wherein at least two of $R_1$ to $R_8$ are groups selected from

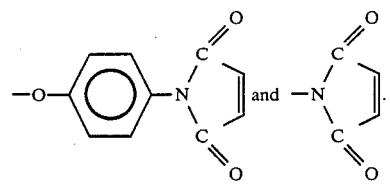

2. A printed circuit board according to claim 1, wherein at least two of the rest of $R_1$ to $R_8$ groups in the general formula [I] and [II] are groups selected from —OH,

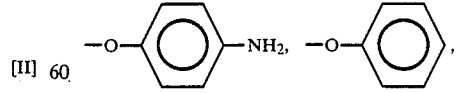

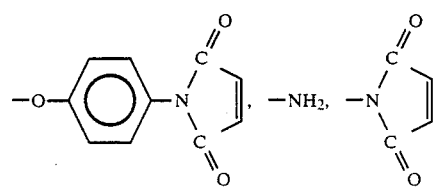

—O—CH=CH$_2$,  —O—CH$_2$CH=CH$_2$, and —O—CF$_2$CF=CF$_2$.

3. A printed circuit board according to claim 1 or 2, wherein the cyclic phosphonitrile compound has at least three maleimido groups.

4. A printed circuit board according to claim 1 or claim 2, wherein the amount of the aromatic maleimide compound is 10 to 1,000 parts by weight per 100 parts by weight of the cyclic phosphonitrile compound and the amount of the aromatic amine compound is 10 to 200 parts by weight of the cyclic phosphonitrile compound in the composition.

* * * * *

UNITED STATES PATENT AND TRADEMARK OFFICE
CERTIFICATE OF CORRECTION

PATENT NO. : 4,946,734
DATED : August 7, 1990
INVENTOR(S) : SUGAWARA, et al

It is certified that error appears in the above-identified patent and that said Letters Patent is hereby corrected as shown below:

In column 9, in claim 1, line 47 "formula" should read --formulae--

In column 10, in claim 2, line 54, "formula" should read --formulae--

In column 12, in claim 4, line 5, after "weight" insert --per 100 parts by weight--.

Signed and Sealed this

Thirteenth Day of April, 1993

*Attest:*

STEPHEN G. KUNIN

*Attesting Officer*  *Acting Commissioner of Patents and Trademarks*